(12) United States Patent
Bowers et al.

(10) Patent No.: US 8,426,842 B2
(45) Date of Patent: Apr. 23, 2013

(54) DOPED GRAPHENE ELECTRONIC MATERIALS

(75) Inventors: Jeffrey A. Bowers, Kirkland, WA (US); Roderick A. Hyde, Redmond, WA (US); Muriel Y. Ishikawa, Livermore, CA (US); Jordin T. Kare, Seattle, WA (US); Clarence T. Tegreene, Bellevue, WA (US); Tatsushi Toyokuni, Paradise, CA (US); Richard N. Zare, Stanford, CA (US)

(73) Assignee: The Invention Science Fund I, LLC, Bellevue, WA (US)

( * ) Notice: Subject to any disclaimer, the term of this patent is extended or adjusted under 35 U.S.C. 154(b) by 519 days.

(21) Appl. No.: 12/800,058

(22) Filed: May 7, 2010

(65) Prior Publication Data

US 2011/0186806 A1    Aug. 4, 2011

Related U.S. Application Data

(63) Continuation-in-part of application No. 12/658,168, filed on Feb. 2, 2010, now Pat. No. 8,278,643.

(51) Int. Cl.
*H01L 29/06* (2006.01)
*H01L 21/20* (2006.01)

(52) U.S. Cl.
USPC ............... 257/9; 257/E29.001; 257/E21.001; 438/478

(58) Field of Classification Search .......... None
See application file for complete search history.

(56) References Cited

U.S. PATENT DOCUMENTS

| | | |
|---|---|---|
| 6,875,274 B2 | 4/2005 | Wong et al. |
| 7,015,142 B2 | 3/2006 | DeHeer et al. |
| 7,327,000 B2 | 2/2008 | DeHeer et al. |
| 7,449,133 B2 | 11/2008 | Gruner et al. |
| 7,572,482 B2 | 8/2009 | Carothers et al. |
| 7,601,322 B2 | 10/2009 | Huang |
| 7,611,628 B1 | 11/2009 | Hinds, III |
| 7,611,906 B2 | 11/2009 | Yaniv |
| 7,633,080 B2 | 12/2009 | Dubin |
| 8,075,864 B2 | 12/2011 | Choi et al. |
| 8,088,352 B2 | 1/2012 | Lukehart et al. |
| 8,168,964 B2 | 5/2012 | Hiura et al. |
| 2002/0085968 A1 | 7/2002 | Smalley et al. |
| 2002/0136681 A1 | 9/2002 | Smalley et al. |
| 2003/0044608 A1 | 3/2003 | Yoshizawa et al. |
| 2005/0255030 A1 | 11/2005 | Tour et al. |

(Continued)

FOREIGN PATENT DOCUMENTS

JP    2009200177 A    9/2009
WO    WO 2008/156583 A1    12/2008

(Continued)

OTHER PUBLICATIONS

Allen, Matthew J. et al.; "Honeycomb Carbon: A Review of Graphene"; Chemical Reviews; Bearing a date of Feb. 20, 2009; pp. A-N; American Chemical Society.

(Continued)

*Primary Examiner* — Ha Tran T Nguyen
*Assistant Examiner* — Kevin Quinto

(57) ABSTRACT

A graphene substrate is doped with one or more functional groups to form an electronic device.

40 Claims, 4 Drawing Sheets

U.S. PATENT DOCUMENTS

| | | | |
|---|---|---|---|
| 2006/0099750 A1 | 5/2006 | DeHeer et al. |
| 2007/0187694 A1 | 8/2007 | Pfeiffer |
| 2007/0212538 A1 | 9/2007 | Niu |
| 2007/0243319 A1 | 10/2007 | Carothers et al. |
| 2007/0284557 A1 | 12/2007 | Gruner et al. |
| 2007/0287011 A1 | 12/2007 | DeHeer |
| 2008/0093211 A1 | 4/2008 | Ramanath et al. |
| 2009/0029221 A1 | 1/2009 | Goddard et al. |
| 2009/0140801 A1 | 6/2009 | Ozyilmaz et al. |
| 2009/0146111 A1 | 6/2009 | Shin et al. |
| 2009/0174435 A1 | 7/2009 | Stan et al. |
| 2009/0181502 A1 | 7/2009 | Parikh et al. |
| 2009/0200707 A1 | 8/2009 | Kivioja et al. |
| 2009/0278257 A1 | 11/2009 | Dubin |
| 2009/0324897 A1 | 12/2009 | Choi et al. |
| 2010/0006823 A1 | 1/2010 | Anderson et al. |
| 2010/0012923 A1 | 1/2010 | Hiura et al. |
| 2010/0032409 A1 | 2/2010 | Hong et al. |
| 2010/0258786 A1 | 10/2010 | Wang et al. |
| 2011/0014457 A1 | 1/2011 | Quitoriano et al. |
| 2011/0030991 A1* | 2/2011 | Veerasamy | 174/126.1 |
| 2011/0068290 A1 | 3/2011 | Haddon et al. |
| 2011/0089404 A1 | 4/2011 | Marcus et al. |
| 2011/0102068 A1 | 5/2011 | Bouchiat et al. |
| 2011/0108806 A1 | 5/2011 | Davidovic et al. |
| 2011/0127638 A1 | 6/2011 | Brenner et al. |
| 2011/0143101 A1 | 6/2011 | Sandhu |
| 2011/0165321 A1 | 7/2011 | Zhamu et al. |
| 2011/0170330 A1 | 7/2011 | Oezyilmaz et al. |
| 2011/0183180 A1 | 7/2011 | Yu et al. |
| 2011/0186805 A1 | 8/2011 | Bowers et al. |
| 2011/0186817 A1 | 8/2011 | Bowers et al. |
| 2011/0201201 A1 | 8/2011 | Arnold et al. |

FOREIGN PATENT DOCUMENTS

| | | |
|---|---|---|
| WO | WO 2009/085015 A1 | 7/2009 |
| WO | WO 2009/148679 A2 | 12/2009 |
| WO | WO 2009/158117 A2 | 12/2009 |

OTHER PUBLICATIONS

An, Kay Hyeok et al.; "Electronic-Structure Engineering of Carbon Nanotubes"; NANO: Brief Reports and Reviews; Bearing a date of 2006; pp. 115-138; vol. 1, No. 2; World Scientific Publishing Company.

Baker, Sarah E. et al.; "Covalently Bonded Adducts of Deoxyribonucleic Acid (DNA) Oligonucleotides with Single-Wall Carbon Nanotubes: Synthesis and Hybridization"; Nano Letters; Bearing a date of 2002; pp. 1413-1417; vol. 2, No. 12; American Chemical Society.

Banerjee, Sarbajit et al.; "Covalent Surface Chemistry of Single-Walled Carbon Nanotubes**"; Advanced Materials; Bearing a date of Jan. 6, 2005; pp. 17-29; vol. 17, No. 1; Wiley-VCH Verlag GmbH & Co. KGaA, Weinheim.

Bekyarova, Elena et al.; "Rapid Research Letter: Chemical approach to the realization of electronic devices in epitaxial graphene"; Wiley InterScience; Bearing a date of 2009; Printed on Jul. 14, 2009; pp. 1-2; located at http://www3.interscience.wiley.com/journal/122431553/abstract (abstract only).

Benayad, Anass et al.; "Controlling work function of reduced graphite oxide with Au-ion concentration"; Chemical Physical Letters; Bearing a date of 2009; pp. 91-95; vol. 475; Elsevier B.V.

Berger, Claire et al.; "Electronic Confinement and Coherence in Patterned Epitaxial Graphene"; Science; Bearing a date of May 26, 2006; pp. 1191-1196; vol. 312; located at www.sciencemag.org.

Bieri, Marco et al.; "Porous graphenes: two-dimensional polymer synthesis with atomic precision"; Chemical Communications; Bearing a date of 2009; Printed on Sep. 30, 2009; pp. 1-6; RSCPublishing.

Boukhvalov, D. W. et al.; "Chemical functionalization of graphene"; Bearing a date of Jan. 5, 2009; pp. 1-13.

Burghard, Marko; "Asymmetric End-Functionalization of Carbon Nanotubes"; Wiley InterScience; Bearing a date of 2005; pp. 1148-1150; vol. 1, No. 12; Wiley-VCH Verlag GmbH & Co. KGaA, D-69451 Weinheim.

Campos, Leonardo C. et al.; "Anisotropic Etching and Nanoribbon Formation in Single-Layer Graphene"; Nano Letters; Bearing a date of 2009; pp. 2600-2604; vol. 9, No. 7; American Chemical Society.

Chen, Peng et al.; "Review Article: Preparation, Properties and Application of Polyamide/Carbon Nanotube Nanocomposites"; Macromolecular Research; Bearing a date of Apr. 25, 2009; pp. 207-217; vol. 17, No. 4; Polymer Society of Korea.

Choi, Junghun et al.; "Chemical Doping of Epitaxial Graphene by Organic Free Radicals"; The Journal of Physical Chemistry Letters; Bearing a date of 2010; pp. 505-509; vol. 1; American Chemical Society.

Choi, Junghun et al.; "Covalent Functionalization of Epitaxial Graphene by Azidotrimethylsilane"; The Journal of Physical Chemistry Letters; Bearing a date of 2009; pp. 9433-9435; vol. 113; American Chemical Society.

Ci, Lijie et al.; "Graphene Shape Control by Multistage Cutting and Transfer"; Advanced Materials; Bearing a date of 2009; pp. 1-5; vol. 21; Wiley-VCH Verlag GmbH & Co. KGaA, Weinheim.

Cong, C. X. et al.; "Fabrication of Graphene Nanodisk Arrays Using Nanosphere Lithography"; J. Phys. Chem. C; Bearing a date of 2009; pp. 6529-6532; vol. 113; American Chemical Society.

Cote, Laura J. et al.; "Flash Reduction and Patterning of Graphite Oxide and Its Polymer Composite"; Journal of the American Chemical Society; Bearing a date of Jul. 14, 2009; pp. A-F; American Chemical Society.

Dong, Xiaochen et al.; "Doping Single-Layer Graphene with Aromatic Molecules"; Small Journal; Bearing a date of 2009; pp. 1422-1426; vol. 5, No. 12; Wiley-VCH Verlag GmbH & Co. KGaA, Weinheim.

Dreyer, Daniel R. et al.; "The chemistry of graphene oxide"; Chemical Society Reviews; Bearing a date of 2010; pp. 228-240; vol. 39; The Royal Society of Chemistry.

Elias D. C. et al.; "Control of Graphene's Properties by Reversible Hydrogenation: Evidence for Graphene"; Science; Bearing a date of Jan. 30, 2009; pp. 610-613 and Supplemental pp. 1-S through 12-S; vol. 323; located at www.sciencemag.org.

Farmer, Damon B. et al.; "Chemical Doping and Electron—Hole Conduction Asymmetry in Graphene Devices"; Nano Letters; Bearing a date of 2009; pp. 388-392; vol. 9 , No. 1; American Chemical Society.

Frazier, Rachel M. et al.; "Recent Progress in Graphene-Related Nanotechnologies"; IngentaConnect; Bearing a date of Nov. 2009; Printed on Nov. 23, 2009; pp. 1-2; Ingenta; located at http://www.ingentaconnect.com/content/ben/nanotec/2009/00000003/00000003/art00001 (abstract only).

Geim, A. K.; "Graphene: Status and Prospects"; Science; Bearing a date of Jun. 19, 2009; pp. 1530-1534; vol. 324; located at www.sciencemag.org.

Geim, A. K. et al.; "The rise of graphene"; Nature Materials; Bearing a date of Mar. 2007; pp. 183-191; vol. 6; Nature Publishing Group.

Gierz, Isabella et al.; "Atomic Hole Doping of Graphene"; Nano Letters; Bearing a date of 2008; pp. 4603-4607; vol. 8, No. 12; American Chemical Society.

Han, Melinda Y. et al.; "Energy Band-Gap Engineering of Graphene Nanoribbons"; Physical Review Letters; Bearing a date of May 18, 2007; pp. 206805-1 through 206805-4; vol. 98, No. 20; The American Physical Society.

Jacoby, Mitch; "Materials Science: Graphene Via Self-Assembly: Preparation method uses mild conditions to make single-layer products"; Chemical & Engineering News; Bearing a date of Jul. 8, 2009; pp. 1; American Chemical Society.

Jin, Chuanhong et al.; "Deriving Carbon Atomic Chains from Graphene"; Physical Review Letters; Bearing a date of May 22, 2009; pp. 205501-1 through 205501-4; vol. 102, No. 20; The American Physical Society.

Jung, Naeyoung et al.; "Charge Transfer Chemical Doping of Few Layer Graphenes: Charge Distribution and Band Gap Formation"; Nano Letters; Bearing a date of 2009; pp. 4133-4137; vol. 9, No. 12; American Chemical Society.

Kamat, Prashant V.; "Graphene-Based Nanoarchitectures. Anchoring Semiconductor and Metal Nanoparticles on a Two-Dimensional Carbon Support"; The Journal of Physical Chemistry Letters; Bearing a date of 2010; pp. 520-527; vol. 1; American Chemical Society.

Khomyakov, P. A. et al.; "First-principles study of the interaction and charge transfer between graphene and metals"; Physical Review B; Bearing a date of 2009; pp. 195425-1 through 195425-12; vol. 79; The American Physical Society.

Kim, Keun Soo et al.; "Large-scale pattern growth of graphene films for stretchable transparent electrodes"; Nature; Bearing a date of 2009; pp. 1-5; Macmillan Publishers Limited.

Kim et al.; "Surface property change of graphene using nitrogen ion"; Journal of Physics: Condensed Matter; bearing a date of 2010; pp. 1-4; vol. 22; IOP Publishing Ltd.

Koehler, Fabian M. et al.; "Permanent Pattern-Resolved Adjustment of the Surface Potential of Graphene-Like Carbon through Chemical Functionalization**"; Angewandte Chemie International Edition; Bearing a date of 2009; pp. 224-227; vol. 48; Wiley-VCH Verlag GmbH & Co. KGaA, Weinheim.

Koehler et al.; "Permanent Pattern-Resolved Adjustment of the Surface Potential of Graphene-Like Carbon through Chemical Functionalization"; bearing a date of Sep. 11, 2008; pp. 1-2; Wiley InterScience; printed on Feb. 8, 2010; located at http://www3.interscience.wiley.com/journal/121538941/abstract?CRETRY=1&SRETRY=0 (abstract only).

Landis, Elizabeth C. et al.; "Covalent Grafting of Redox-Active Molecules to Vertically Aligned Carbon Nanofiber Arrays via "Click" Chemistry"; Chemical Materials; Bearing a date of 2009; pp. 724-730; vol. 21; American Chemical Society.

Lee, Jung Min et al.; "ZnO Nanorod—Graphene Hybrid Architectures for Mulitfunctional Conductors"; J. Phys. Chem. C; Bearing a date of Oct. 14, 2009; pp. A-E; American Chemical Society.

Lemme, Max C. et al.; "Etching of Graphene Devices with a Helium Ion Beam"; www.acsnano.org; Bearing a date of 2009; pp. 2674-2676; vol. 3, No. 9; American Chemical Society.

Li, Dan et al.; "Materials Science: Graphene-Based Materials"; Science; Bearing a date of May 30, 2008; pp. 1170-1171; vol. 320; AAAS; located at www.sciencemag.org.

Li, Sinan et al.; "DNA-Directed Self-Assembling of Carbon Nanotubes"; Journal of American Chemical Society; Bearing dates of 2005 and Dec. 8, 2004; pp. 14-15; vol. 127; American Chemical Society.

Li, Xuesong et al.; "Large-Area Synthesis of High-Quality and Uniform Graphene Films on Copper Foils"; Sciencexpress; Bearing a date of May 7, 2009; pp. 1-6; located at www.sciencexpress.org.

Liu, Haitao et al.; "Photochemical Reactivity of Graphene"; Journal of the American Chemical Society; Bearing a date of 2009; pp. 17099-17101; vol. 131; American Chemical Society.

Liu, Li-Hong et al.; "Simple Method for the Covalent Immobilization of Graphene"; ACS Publications, Nano Letters; Bearing a date of 2009; Printed on Sep. 26, 2009; pp. 1; American Chemical Society; located at http://pubs.acs.org/doi/abs/10.1021/nl901669h (abstract only).

Lohmann, Timm et al.; "Four-Terminal Magneto-Transport in Graphene p-n Junctions Created by Spatially Selective Doping"; Nano Letters; Bearing a date of 2009, pp. 1973-1979; vol. 9, No. 5; American Chemical Society.

Luo, Zhiqiang et al.; "Thickness-Dependent Reversible Hydrogenation of Graphene Layers"; www.acsnano.org; Bearing a date of 2009; pp. 1781-1788; vol. 3, No. 7; American Chemical Society.

Lusk et al.; "Nano-Engineering Defect Structures on Graphene"; Physical Review Letters; bearing a date of May 2, 2008; pp. 1-4; vol. 100, Issue 175503; The American Physical Society.

Nair, R. R. et al.; "Fine Structure Constant Defines Visual Transparency of Graphene"; Science; Bearing a date of Jun. 6, 2008; pp. 1308 with Supporting Online Material pp. 1-7; vol. 320; located at www.sciencemag.org.

Neto, A. H. Castro et al.; "The electronic properties of graphene"; Reviews of Modern Physics; Bearing a date of Jan.-Mar. 2009; pp. 109-162; vol. 81; The American Physical Society.

Panchakarla, L. S. et al.; "Synthesis, Structure, and Properties of Boron- and Nitrogen-Doped Graphene" Advanced Materials; Bearing a date of 2009; pp. 4726-4730; vol. 21; Wiley-VCH Verlag GmbH & Co. KGaA, Weinheim.

Park, Sungjin et al.; "Graphene Oxide Papers Modified by Divalent Ions—Enhancing Mechanical Properties via Chemical Cross-Linking"; www.acsnano.org; Bearing a date of 2008; pp. 572-578; vol. 2, No. 3; American Chemical Society.

Patolsky, Fernando et al.; "Nanotechnology: Long-Range Electrical Contacting of Redox Enzymes by SWCNT Connectors**"; Angewandte Chemie International Edition; Bearing a date of 2004; pp. 2113-2117; vol. 43; Wiley-VCH Verlag GmbH & Co. KGaA, Weinheim.

Rao, C. N. R. et al.; "Graphene, the new nanocarbon"; Journal of Materials Chemistry; Bearing a date of 2009; pp. 2457-2469; vol. 19; The Royal Society of Chemistry.

Rao, C. N. R. et al.; "Nanomaterials: Graphene: The New Two-Dimensional Nanomaterial"; Angewandte Chemie International Edition; Bearing a date of 2009; pp. 7752-7777; vol. 48; Wiley-VCH Verlag GmbH & Co. KGaA, Weinheim.

Ritter, Kyle A. et al.; "The influence of edge structure on the electronic properties of graphene quantum dots and nanoribbons"; Nature Materials; Bearing a date of Mar. 2009; pp. 235-242; vol. 8.

Ryu, Sunmin et al.; "Reversible Basal Plane Hydrogenation of Graphene"; Nano Letters; Bearing a date of 2008; pp. 4597-4602; vol. 8, No. 12; American Chemical Society.

Samarakoon, Duminda K. et al.; "Chair and Twist-Boat Membranes in Hydrogenated Graphene"; www.acsnano.org; Bearing a date of 2008; pp. A-F; American Chemical Society.

Sano, Masahito et al.; "Ring Closure of Carbon Nanotubes"; Science; Bearing a date of Aug. 17, 2001; pp. 1299-1301; vol. 293; located at www.sciencemag.org.

Sessi, Paolo et al.; "Patterning Graphene at the Nanometer Scale via Hydrogen Desorption"; ACS Publications, Nano Letters; Bearing a date of 2009; Printed on Nov. 6, 2009; pp. 1-2; American Chemical Society; located at http://pubs.acs.org/action/showMultipleAbstracts (abstract only).

Severin, N. et al.; "Rapid Trench Channeling of Graphenes with Catalytic Silver Nanoparticles"; Nano Letters; Bearing a date of 2009; pp. 457-461; vol. 9, No. 1; American Chemical Society.

Shen, Jianfeng et al.; "Layer-by-Layer Self-Assembly of Graphene Nanoplatelets"; Langmuir; Bearing a date of 2009; pp. 6122-6128; vol. 25, No. 11; American Chemical Society.

Shivaraman, Shriram et al.; "Free-Standing Epitaxial Graphene"; Nano Letters; Bearing a date of 2009; pp. 3100-3105; vol. 9, No. 9; American Chemical Society.

Song, Li et al.; "Transfer Printing of Graphene Using Gold Film"; www.acsnano.org; Bearing dates of Mar. 27, 2009 and May 7, 2009; pp. A-D; American Chemical Society.

Sprinkle, M. et al.; "Epitaxial graphene: the material for graphene electronics"; Phys. Status Solidi RRL—Rapid Research Letters; Bearing a date of 2009; pp. A91-A94; vol. 3, No. 6; Wiley-VCH Verlag GmbH & Co. KGaA, Weinheim.

Strano, Michael S. et al.; "Electronic Structure Control of Single-Walled Carbon Nanotube Functionalization"; Science; Bearing a date of Sep. 12, 2003; pp. 1519-1522; vol. 301; located at www.sciencemag.org.

Tapasztó, L. et al.; "Tuning the electronic structure of graphene by ion irradiation"; Physical Review B; Bearing a date of 2008; pp. 233407-1 through 233407-4; vol. 78; The American Physical Society.

Tasis, Dimitrios et al.; "Chemistry of Carbon Nanotubes"; Chemical Reviews; Bearing a date of 2006; pp. 1105-1136; vol. 106; American Chemical Society.

Tung, Vincent C. et al.; "Low-Temperature Solution Processing of Graphene—Carbon Nanotube Hybrid Materials for High-Performance Transparent Conductors"; Nano Letters; Bearing a date of 2009; pp. 1949-1955; vol. 9, No. 5; American Chemical Society.

Wang, Da-Wei et al.; "Fabrication of Graphene/Polyaniline Composite Paper via In Situ Anodic Electropolymerization for High-Performance Flexible Electrode"; www.acsnano.org; Bearing a date of 2009; pp. 1745-1752; vol. 3, No. 7; American Chemical Society.

Wang, Qing Hua et al.; "Room-temperature molecular-resolution characterization of self-assembled organic monolayers on epitaxial graphene"; Nature Chemistry; Bearing a date of Jun. 2009; pp. 206-211; vol. 1; Macmillan Publishers Limited.

Wang, Xinran et al.; "N-Doping of Graphene Through Electrothermal Reactions with Ammonia"; Science; Bearing a date of May 8, 2009; Printed on May 30, 2009; pp. 1-2; vol. 324, No. 5928; located at http://www.sciencemag.org/cgi/content/abstract/324/5928/768 (abstract only).

Wei, Dacheng et al.; "Synthesis of N-Doped Graphene by Chemical Vapor Deposition and Its Electrical Properties"; Nano Letters; Bearing a date of 2009; pp. 1752-1758; vol. 9, No. 5; American Chemical Society.

Wu, Menghao et al.; "Materials design of half-metallic graphene and graphene nanoribbons"; Applied Physics Letters; Bearing a date of 2009; pp. 223111-1 through 223111-3; vol. 94; American Institute of Physics.

Wu, Menghao et al.; "Patterned Hydrogenation of Graphene: Magnetic Quantum Dot Array"; ACS Publications, The Journal of Physical Chemistry C; Bearing a date of 2009; Printed on Nov. 24, 2009; pp. 1; vol. 114, No. 1; American Chemical; located at http://pubs.acs.org/doi/abs/10.1021/jp9086128 (abstract only).

Xiang, Hongjun et al.; "'Narrow' Graphene Nanoribbons Made Easier by Partial Hydrogenation"; Bearing a date of May 12, 2009; pp. 1-16.

Zhang, Yuanbo et al.; "Direct observation of a widely tunable bandgap in bilayer graphene"; Nature; Bearing a date of Jun. 11, 2009; pp. 820-823; vol. 459; Macmillan Publishers Limited.

Zhou, J. et al; "Ferromagnetism in Semihydrogenated Graphene Sheet"; Nano Letters; Bearing a date of Aug. 31, 2009; pp. A-D; American Chemical Society.

Zhou, Jian et al.; "Tuning electronic and magnetic properties of graphene by surface modification"; Applied Physics Letters; Bearing a date of 2009; pp. 103108-1 through 103108-3; vol. 95; American Institute of Physics.

Zhu, Yu et al.; "Covalent Functionalization of Surfactant-Wrapped Graphene Nanoribbons"; ACS Publications, Chemistry of Materials; Bearing a date of 2009; pp. 1; vol. 21, No. 21; American Chemical Society; located at http://pubs.acs.org/doi/abs/10.1021/cm902939n; (abstract only).

Bahat-Treidel, Omri et al., "Klein Tunneling in Deformed Honeycomb Lattices", The American Physical Society, Physical Review Letters, vol. 106, Issue 06, (Feb. 12, 2010), pp. 063901-1-063901-4.

Chiu, Hsin-Ying et al., "Controllable p-n Junction Formation in Monolayer Graphene Using Electrostatic Substrate Engineering", NANO Letters, American Chemical Society, vol. 10, Issue 11, (Oct. 1, 2010), pp. 4634-4639 and pp. 1-4 (Supplemental Information).

Guo, Beidou et al., "Graphene Doping: A Review", Insciences Journal, Review Paper, ISSN 1664-171X, vol. 1, Issue 2, (Apr. 27, 2011), pp. 80-89.

Huard, B. et al., "Transport Measurements Across a Tunable Potential Barrier in Graphene", The American Physical Society, Physical Review Letters, vol. 98, Issue 23, (Jun. 8, 2007), pp. 236803-1-236803-4.

Brenner, Kevin et al., "Single step, complementary doping of graphene", American Institute of Physics, Applied Physics Letters, vol. 96, Issue 6, (Feb. 10, 2010), pp. 063104-1-063104-3.

Kim, Myungwoong et al., "Fabrication and Characterization of Large-Area, Semiconducting Nanoperforated Graphene Materials", NANO Letters, American Chemical Society, vol. 10, Issue 4, (Mar. 1, 2010), pp. 1125-1131.

Peters, Eva et al., "Gate dependent photocurrents at a graphene p-n junction", American Institute of Physics, Applied Physics Letters, vol. 97, Issue 19, (Nov. 9, 2010), 193102-1-193102-3.

Stander, N. et al., "Evidence for Klein Tunneling in Graphene p-n Junctions", The American Physical Society, Physical Review Letters, vol. 102, Issue 02, (Jan. 16, 2009), pp. 026807-1-026807-4.

Williams, J. R., et al., "Quantum Hall Effect in a Gate-Controlled p-n Junction of Graphene", Science, vol. 317, No. 5838, (Aug. 3, 2007), pp. 638-641.

Young, Andrea et al., "Quantum interference and Klein tunnelling in graphene heterojunctions", Letters, Nature Physics, vol. 05, (Feb. 1, 2009), pp. 222-226.

PCT International Search Report; International App. No. PCT/US 11/00187; Apr. 4, 2011; pp. 1-2.

Office Action received for U.S. Appl. No. 12/800,072, mailed on Jan. 30, 2013, 37 pages.

Farmer et al., "Behavior of a chemically doped graphene junction" May 28, 2009, Applied Physics Letters 94, 213106, 3 pages.

Notice of Allowance received for U.S. Appl. No. 12/800,130, mailed on Feb. 6, 2013, 7 pages.

\* cited by examiner

DOPED GRAPHENE ELECTRONIC MATERIALS

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)). All subject matter of the Related Applications and of any and all parent, grandparent, great-grandparent, etc. applications of the Related Applications is incorporated herein by reference to the extent such subject matter is not inconsistent herewith.

RELATED APPLICATIONS

For purposes of the USPTO extra-statutory requirements, the present application constitutes a continuation-in-part of U.S. patent application Ser. No. 12/658,168, entitled DOPED GRAPHENE ELECTRONIC MATERIALS, naming Jeffrey A. Bowers, Roderick A. Hyde, Muriel Y. Ishikawa, Jordin T. Kare, Clarence T. Tegreene, Tatsushi Toyokuni and Richard N. Zare as inventors, filed 2 Feb. 2010, now U.S. Pat. No. 8,278,643, which is currently co-pending, or is an application of which a currently co-pending application is entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, *Benefit of Prior-Filed Application*, USPTO Official Gazette Mar. 18, 2003, available at http://www.uspto.gov/web/offices/com/sol/og/2003/week11/patbene.htm. The present Applicant Entity (hereinafter "Applicant") has provided above a specific reference to the application(s) from which priority is being claimed as recited by statute. Applicant understands that the statute is unambiguous in its specific reference language and does not require either a serial number or any characterization, such as "continuation" or "continuation-in-part," for claiming priority to U.S. patent applications. Notwithstanding the foregoing, Applicant understands that the USPTO's computer programs have certain data entry requirements, and hence Applicant is designating the present application as a continuation-in-part of its parent applications as set forth above, but expressly points out that such designations are not to be construed in any way as any type of commentary and/or admission as to whether or not the present application contains any new matter in addition to the matter of its parent application(s).

SUMMARY

In one aspect, an electronic device includes a graphene substrate including a first defined region and a second defined region differing in at least one electronic property (e.g., Fermi level, band structure, carrier populations, mobility, tunneling behavior, or conductive character) from the first defined region. The first defined region is chemically functionalized with a first dopant species and the second defined region is chemically functionalized with a second dopant species. The difference in the at least one electronic property may be a consequence of the functionalization. The first and second defined regions may form a semiconducting junction, and may be parts of a component such as a diode, a transistor, a switch, a resistor, a capacitor, an inductor, a sensor, or an interconnect. The device may further include interconnects electrically connected to the first and second defined regions. The graphene substrate may include a single layer or a multilayer. The first and second regions may be adjacent, and either or both may be remote from an edge of the graphene substrate. The device may further include a third defined region differing in at least one electronic property from the first and second defined regions, which may be functionalized with a third dopant species. The graphene substrate may be disposed on a base substrate (e.g., graphite or a crystal containing a noncarbon component). The first and second dopant species may functionalize a common surface of the substrate or opposing surfaces, and either or both may include an amine, an imine, an organic free radical, an aromatic molecule, nitrogen, boron, gold, bismuth, antimony, bromine, iodine, a diazonium salt, hydrogen, or an alkyl group, and may be different or the same. The first and second dopant species may differ in concentration, attachment pattern to the graphene substrate, or number density.

Either or both dopant species may include a plurality of intermixed dopant subspecies, which may include the same or different subspecies, and which may differ in attachment pattern or relative concentration from one another. One or more dopant subspecies may vary in concentration within the first defined region. The first dopant species may include a first bound moiety affixed to the graphene substrate and a first free moiety removably attached to the first bound moiety, in which case the difference in the electronic property may be a function of a property of the free moiety. The second dopant species may include a second bound moiety affixed to the graphene substrate and a second free moiety removably attached to the second bound moiety, in which case the first and second bound moieties may be the same or different. The first dopant species may be adsorbed onto the graphene substrate (e.g., chemisorbed or physisorbed), chemically bound to the substrate (e.g., covalently bound), or intercalated in the graphene substrate. The first dopant species may vary in concentration or attachment pattern within the first defined region. The second defined region may surround the first defined region.

In another aspect, an electronic device includes a graphene substrate including a first defined region and a second defined region differing in at least one electronic property (e.g., Fermi level, band structure, carrier populations, mobility, tunneling behavior, or conductive character) from the first defined region. The first region is chemically functionalized with a first dopant species and is remote from any edge of the graphene substrate.

The second defined region may be chemically functionalized with a second dopant species, which may differ from the first dopant species. The first and second dopant species may differ in concentration, attachment pattern on the graphene substrate, or number density. Either or both dopant species may include a plurality of intermixed dopant subspecies, which may include the same or different subspecies, and which may differ in attachment pattern or relative concentration from one another. One or more dopant subspecies may vary in concentration within the first defined region. The first and second dopant species may functionalize a common surface of the substrate or opposing surfaces, and either or both may include an amine, an imine, an organic free radical, an aromatic molecule, nitrogen, boron, gold, bismuth, antimony, bromine, iodine, a diazonium salt, hydrogen, or an alkyl group, and may be different or the same.

The difference in the at least one electronic property may be a consequence of the functionalization. The first and second defined regions may form a semiconducting junction, and may be parts of a component such as a diode, a transistor, a switch, a resistor, a capacitor, an inductor, a sensor, or an interconnect. The device may further include interconnects electrically connected to the first and second defined regions. The graphene substrate may include a single layer or a multilayer. The first and second regions may be adjacent, and either or both may be remote from an edge of the graphene substrate. The device may further include a third defined region differing in at least one electronic property from the first and second defined regions, which may be functionalized with a third dopant species. The graphene substrate may be disposed on a base substrate (e.g., graphite or a crystal containing a noncarbon component). The first dopant species may include a first bound moiety affixed to the graphene substrate and a first free moiety removably attached to the first bound moiety, in which case the difference in the electronic property may be a function of a property of the free moiety. The second defined region may be chemically functionalized with a second dopant species including a second bound moiety affixed to the graphene substrate and a second free moiety removably attached to the second bound moiety, in which case the composition of the first and second bound moieties may be the same or different. The first dopant species may be adsorbed onto the graphene substrate (e.g., chemisorbed or physisorbed), chemically bound to the substrate (e.g., covalently bound), or intercalated in the graphene substrate. The first dopant species may vary in concentration or attachment pattern within the first defined region. The second defined region may surround the first defined region.

In another aspect, an electronic circuit includes a graphene substrate including a first device and a second device. The first device includes a first defined region and a second defined region differing in at least one first electronic property (e.g., Fermi level, band structure, carrier populations, mobility, tunneling behavior, or conductive character) from the first defined region, wherein the first region is chemically functionalized with a first dopant species. The second device includes a third defined region and a fourth defined region differing in at least one second electronic property (e.g., Fermi level, band structure, carrier populations, mobility, tunneling behavior, or conductive character) from the third defined region, wherein the third region is chemically functionalized with a second dopant species.

The first and second dopant species may be the same or different. The first and second devices have substantially the same electronic character. The circuit may further include a fifth defined region of the graphene substrate that functions as an interconnect between the first and second devices. The at least one first electronic property and the at least one second electronic property may include a common electronic property. The difference in the at least one first electronic property may be a consequence of the functionalization of the first and second defined regions, or the difference in the at least one second electronic property may be a consequence of the functionalization of the third and fourth defined regions. The first and second defined regions, or the third and fourth defined regions, may form a semiconducting junction. The first or second device may be a diode, a transistor, a switch, a resistor, a capacitor, an inductor, a sensor, or an interconnect.

The graphene substrate may include a single layer or a multilayer. The first defined region and the second defined region, or the third defined region and the fourth defined region, may be adjacent. The first or second defined region may not include an edge of the graphene substrate. The graphene substrate may be disposed on a base substrate (e.g., graphite or a crystal containing a noncarbon component). The first dopant species and the second dopant species may functionalize a common surface of the graphene substrate or opposing surfaces, and the first device and the second device may be positioned on opposing surfaces of the graphene substrate. The first or second dopant species may include at least one of an amine, an imine, an organic free radical, an aromatic molecule, nitrogen, boron, gold, bismuth, antimony, bromine, iodine, a diazonium salt, hydrogen, or an alkyl group.

The second dopant species may differ from the first dopant species. The first and second dopant species may differ in concentration, attachment pattern to the graphene substrate, or number density. Any of the dopant species may include a plurality of intermixed dopant subspecies, which may include the same or different subspecies, and which may differ in attachment pattern or relative concentration from one another. One or more dopant subspecies may vary in concentration within the first defined region. The first dopant species may include a first bound moiety affixed to the graphene substrate and a first free moiety removably attached to the first bound moiety, in which case the difference in the electronic property may be a function of a property of the free moiety. The second dopant species may include a second bound moiety affixed to the graphene substrate and a second free moiety removably attached to the second bound moiety, in which case the first and second bound moieties may be the same or different. The first dopant species may be adsorbed onto the graphene substrate (e.g., chemisorbed or physisorbed), chemically bound to the substrate (e.g., covalently bound), or intercalated in the graphene substrate. The first dopant species may vary in concentration or attachment pattern within the first defined region. The second defined region may surround the first defined region.

In another aspect, a method of forming an electronic device on a graphene substrate includes functionalizing a first defined region of the graphene substrate with a first dopant species, and functionalizing a second defined region of the graphene substrate with a second dopant species. The functionalized first region differs in an electrical property (e.g., Fermi level, band structure, carrier populations, mobility, tunneling behavior, or conductive character) from the functionalized second defined region.

Functionalizing the first defined region may include selectively exposing the first region to a chemical solution, lithographically masking the graphene substrate, applying a spatially patterned electrical potential to the graphene substrate, or introducing a defect into the graphene substrate. The first defined region and the second defined region may be functionalized simultaneously, or the first defined region may be functionalized before the second defined region. The second defined region may overlap the first defined region. Functionalizing the second defined region may include co-depositing the second dopant species with the first dopant species. The first dopant species may exclude the second dopant species from depositing on the graphene substrate. The second defined region may surround the first defined region, or the first defined region may surround the second defined region.

In another aspect, a method of forming an electronic device on a graphene substrate includes functionalizing a first defined region of the graphene substrate with a first dopant species. The functionalized first region differs in an electrical property (e.g., Fermi level, band structure, carrier populations, mobility, tunneling behavior, or conductive character)

from a second defined region (which may or may not be functionalized) and is remote from any edge of the graphene substrate.

Functionalizing the first defined region may include selectively exposing the first region to a chemical solution, lithographically masking the graphene substrate, applying a spatially patterned electrical potential to the graphene substrate, or introducing a defect into the graphene substrate. The first defined region and the second defined region may be functionalized simultaneously, or the first defined region may be functionalized before the second defined region. The second defined region may overlap the first defined region. Functionalizing the second defined region may include co-depositing the second dopant species with the first dopant species. The first dopant species may exclude the second dopant species from depositing on the graphene substrate. The second defined region may surround the first defined region, or the first defined region may surround the second defined region.

In another aspect, an optoelectronic device includes a graphene substrate including a first defined region and a second defined region differing in at least one electro-optical property (e.g., optical gain, transmissivity, reflectivity, permittivity, permeability, refractive index, or anisotropy) from the first defined region. The first region is chemically functionalized with a first dopant species and the second defined region is chemically functionalized with a second dopant species.

The difference in the at least one electro-optical property may be a consequence of the functionalization. The first and second defined regions may be parts of a component such as laser, a light-emitting diode, a plasmon waveguide, an optical waveguide, an optical grating, a fluorescent device, a light-absorbing device, a photoelectron converter, a phaseshifting device, a interferometer, an optical coupler, or a plasmon coupler, and the optoelectronic device may be nonlinear or be a plasmonic device. The device may further include interconnects optically connected to the first and second defined regions. The graphene substrate may include a single layer or a multilayer. The graphene substrate may be disposed on a base substrate (e.g., graphite or a crystal containing a noncarbon component). The first and second dopant species may functionalize a common surface of the substrate or opposing surfaces, and either or both may include an amine, an imine, an organic free radical, an aromatic molecule, nitrogen, boron, gold, bismuth, antimony, bromine, iodine, a diazonium salt, hydrogen, or an alkyl group, and may be different or the same. The first and second dopant species may differ in concentration, attachment pattern to the graphene substrate, or number density.

The first dopant species may include a first bound moiety affixed to the graphene substrate and a first free moiety removably attached to the first bound moiety, in which case the difference in the electro-optical property may be a function of a property of the free moiety. The second dopant species may include a second bound moiety affixed to the graphene substrate and a second free moiety removably attached to the second bound moiety, in which case the first and second bound moieties may be the same or different. The first dopant species may be adsorbed onto the graphene substrate (e.g., chemisorbed or physisorbed), chemically bound to the substrate (e.g., covalently bound), or intercalated in the graphene substrate. The first dopant species may vary in concentration or attachment pattern within the first defined region. The second defined region may surround the first defined region.

In another aspect, an optoelectronic device includes a graphene substrate including a first defined region and a second defined region differing in at least one electro-optical property (e.g., optical gain, transmissivity, reflectivity, permittivity, permeability, refractive index, or anisotropy) from the first defined region. The first region is chemically functionalized with a first dopant species and does not include an edge of the graphene substrate.

The second defined region may be chemically functionalized with a second dopant species, which may differ from the first dopant species. The first and second dopant species may differ in concentration, attachment pattern on the graphene substrate, or number density. The first dopant species may include a first bound moiety affixed to the graphene substrate and a first free moiety removably attached to the first bound moiety, in which case the difference in the electro-optical property may be a function of a property of the free moiety. The second defined region may be chemically functionalized with a second dopant species including a second bound moiety affixed to the graphene substrate and a second free moiety removably attached to the second bound moiety, in which case the composition of the first and second bound moieties may be the same or different. The optoelectronic device may include a laser, a light-emitting diode, a plasmon waveguide, an optical waveguide, an optical grating, a fluorescent device, a light-absorbing device, a photoelectron converter, a phaseshifting device, a interferometer, an optical coupler, or a plasmon coupler, and the optoelectronic device may be nonlinear or be a plasmonic device. The difference in the at least one electro-optical property may be a consequence of the functionalization. The device may further include interconnects optically connected to the first and second defined regions. The graphene substrate may include a single layer or a multilayer. The graphene substrate may be disposed on a base substrate (e.g., graphite or a crystal containing a noncarbon component). The first and second dopant species may functionalize a common surface of the substrate or opposing surfaces, and either or both may include an amine, an imine, an organic free radical, an aromatic molecule, nitrogen, boron, gold, bismuth, antimony, bromine, iodine, a diazonium salt, hydrogen, or an alkyl group, and may be different or the same. The first dopant species may be adsorbed onto the graphene substrate (e.g., chemisorbed or physisorbed), chemically bound to the substrate (e.g., covalently bound), or intercalated in the graphene substrate. The first dopant species may vary in concentration or attachment pattern within the first defined region. The second defined region may surround the first defined region.

In another aspect, an optoelectronic circuit includes a graphene substrate including a first device and a second device. The first device includes a first defined region and a second defined region differing in at least one first electro-optical property (e.g., optical gain, transmissivity, reflectivity, permittivity, permeability, refractive index, or anisotropy) from the first defined region, wherein the first region is chemically functionalized with a first dopant species. The second device includes a third defined region and a fourth defined region differing in at least one second electro-optical property (e.g., optical gain, transmissivity, reflectivity, permittivity, permeability, refractive index, or anisotropy) from the third defined region, wherein the third region is chemically functionalized with a second dopant species.

The first and second dopant species may be the same or different. The first and second devices have substantially the same electro-optical character. The circuit may further include a fifth defined region of the graphene substrate that functions as an optical interconnect between the first and second devices. The at least one first electro-optical property and the at least one second electro-optical property may include a common electro-optical property. The difference in the at least one first electro-optical property may be a consequence of the functionalization of the first and second defined regions, or the difference in the at least one second electro-optical property may be a consequence of the functionalization of the third and fourth defined regions. The first or second device may be a laser, a light-emitting diode, a plasmon waveguide, an optical waveguide, an optical grating, a fluorescent device, a light-absorbing device, a photoelectron converter, a phaseshifting device, a interferometer, an optical coupler, or a plasmon coupler.

The graphene substrate may include a single layer or a multilayer. The first defined region and the second defined region, or the third defined region and the fourth defined region, may be adjacent. The first or second defined region may not include an edge of the graphene substrate. The graphene substrate may be disposed on a base substrate (e.g., graphite or a crystal containing a noncarbon component). The first dopant species and the second dopant species may functionalize a common surface of the graphene substrate or opposing surfaces, and the first device and the second device may be positioned on opposing surfaces of the graphene substrate. The first or second dopant species may include at least one of an amine, an imine, an organic free radical, an aromatic molecule, nitrogen, boron, gold, bismuth, antimony, bromine, iodine, a diazonium salt, hydrogen, or an alkyl group.

The second dopant species may differ from the first dopant species. The first and second dopant species may differ in concentration, attachment pattern to the graphene substrate, or number density. Any of the dopant species may include a plurality of intermixed dopant subspecies, which may include the same or different subspecies, and which may differ in attachment pattern or relative concentration from one another. One or more dopant subspecies may vary in concentration within the first defined region. The first dopant species may include a first bound moiety affixed to the graphene substrate and a first free moiety removably attached to the first bound moiety, in which case the difference in the electro-optical property may be a function of a property of the free moiety. The second dopant species may include a second bound moiety affixed to the graphene substrate and a second free moiety removably attached to the second bound moiety, in which case the first and second bound moieties may be the same or different. The first dopant species may be adsorbed onto the graphene substrate (e.g., chemisorbed or physisorbed), chemically bound to the substrate (e.g., covalently bound), or intercalated in the graphene substrate. The first dopant species may vary in concentration or attachment pattern within the first defined region. The second defined region may surround the first defined region.

In another aspect, a method of forming an optoelectronic device on a graphene substrate includes functionalizing a first defined region of the graphene substrate with a first dopant species, and functionalizing a second defined region of the graphene substrate with a second dopant species. The functionalized first region differs in an electro-optical property (e.g., optical gain, transmissivity, reflectivity, permittivity, permeability, refractive index, or anisotropy) from the functionalized second defined region.

The first dopant species and the second dopant species may be selected to confer a first electro-optical property and a second electro-optical property on the first defined region and second defined region, respectively. Functionalizing the first defined region may include selectively exposing the first region to a chemical solution, lithographically masking the graphene substrate, or applying a spatially patterned electrical potential to the graphene substrate.

In another aspect, a method of forming an optoelectronic device on a graphene substrate includes functionalizing a first defined region of the graphene substrate with a first dopant species. The functionalized first region differs in an electro-optical property (e.g., optical gain, transmissivity, reflectivity, permittivity, permeability, refractive index, or anisotropy) from a second defined region and is remote from any edge of the graphene substrate.

The first dopant species may be selected to confer a first electro-optical property on the first defined region. Functionalizing the first defined region may include selectively exposing the first region to a chemical solution, lithographically masking the graphene substrate, or applying a spatially patterned electrical potential to the graphene substrate.

In another aspect, an electronic device includes a graphene substrate including a junction between an n-type defined region and a p-type defined region. The n-type region is chemically functionalized with a first dopant species and the p-type defined region is chemically functionalized with a second dopant species.

The graphene substrate may further include a neutral region (e.g., an insulator, a semiconductor, or a metal) having substantially fewer free carriers than either the n-type defined region or the p-type defined region. The n-type and p-type defined regions may be parts of a component such as a diode, a transistor, a switch, a resistor, a capacitor, an inductor, a sensor, or an interconnect. The device may further include interconnects electrically connected to the n-type and p-type defined regions. The graphene substrate may include a single layer or a multilayer. Either or both of the n-type and p-type regions may be remote from an edge of the graphene substrate. The device may further include a third defined region differing in at least one electronic property from the n-type and p-type defined regions, which may be functionalized with a third dopant species.

The graphene substrate may be disposed on a base substrate (e.g., graphite or a crystal containing a noncarbon component). The first and second dopant species may functionalize a common surface of the substrate or opposing surfaces, and may be the same or different. The first dopant species may include at least one of an amine, an imine, an organic free radical, or an aromatic molecule, and the second dopant species may include at least one of an aromatic molecule, boron, gold, bismuth, antimony, bromine, iodine, a diazonium salt, hydrogen, and an alkyl group. The first and second dopant species may differ in concentration, attachment pattern to the graphene substrate, or number density.

Either or both dopant species may include a plurality of intermixed dopant subspecies, which may include the same or different subspecies, and which may differ in attachment pattern or relative concentration from one another. One or more dopant subspecies may vary in concentration within the n-type or p-type defined region. The first dopant species may include a first bound moiety affixed to the graphene substrate and a first free moiety removably attached to the first bound moiety, in which case the difference in the electronic property (e.g., free carrier population) may be a function of a property of the free moiety. The second dopant species may include a second bound moiety affixed to the graphene substrate and a second free moiety removably attached to the second bound moiety, in which case the first and second bound moieties may be the same or different. The first or second dopant species may be adsorbed onto the graphene substrate (e.g., chemisorbed or physisorbed), chemically bound to the substrate (e.g., covalently bound), or intercalated in the graphene substrate. The first or second dopant species may vary in concentration or attachment pattern within the n-type or p-type defined region. The p-type defined region may surround the n-type defined region, or the n-type defined region may surround the p-type defined region.

In another aspect, an electronic device includes a graphene substrate including a first defined region chemically functionalized with a first dopant species. The first dopant species has a concentration that varies across the first defined region (e.g., stepwise across the defined region or smoothly across the defined region).

The device may have at least one electronic property (e.g., Fermi level, band structure, carrier populations, mobility, tunneling behavior, or conductive character) that varies across the first defined region, for example as a consequence of the functionalization of the first defined region. The first region may be part of a component such as a diode, a transistor, a switch, a resistor, a capacitor, an inductor, a sensor, or an interconnect. The device may further include an interconnect electrically connected to the first defined region. The graphene substrate may include a single layer or a multilayer. The first region may be remote from an edge of the graphene substrate. The graphene substrate may be disposed on a base substrate (e.g., graphite or a crystal containing a noncarbon component). The first dopant species may include an amine, an imine, an organic free radical, an aromatic molecule, nitrogen, boron, gold, bismuth, antimony, bromine, iodine, a diazonium salt, hydrogen, or an alkyl group, and may vary in attachment pattern to the graphene substrate.

The first dopant species may include a plurality of intermixed dopant subspecies. One or more dopant subspecies may vary in concentration within the first defined region. The first dopant species may include a first bound moiety affixed to the graphene substrate and a first free moiety removably attached to the first bound moiety, in which case the difference in the electronic property may be a function of a property of the free moiety. The first dopant species may be adsorbed onto the graphene substrate (e.g., chemisorbed or physisorbed), chemically bound to the substrate (e.g., covalently bound), or intercalated in the graphene substrate.

In another aspect, an electronic circuit includes a first device and a second device. The first device includes a first junction between a first n-type defined region and a first p-type defined region, wherein the first n-type region is chemically functionalized with a first dopant species and the first p-type defined region is chemically functionalized with a second dopant species. The second device includes a second junction between a second n-type defined region and a second p-type defined region, wherein the n-type region is chemically functionalized with a third dopant species and the p-type defined region is chemically functionalized with a fourth dopant species.

The first and third dopant species, or the second and fourth dopant species, may be the same, and the first and second devices may have substantially the same electronic character. The circuit may further include a fifth defined region of the graphene substrate that functions as an interconnect between the first and second devices. The first or second device may be a diode, a transistor, a switch, a resistor, a capacitor, an inductor, a sensor, or an interconnect. The graphene substrate may include a single layer or a multilayer.

The first n-type or first p-type defined region may not include an edge of the graphene substrate. The graphene substrate may be disposed on a base substrate (e.g., graphite or a crystal containing a noncarbon component). The first dopant species and the second dopant species may functionalize a common surface of the graphene substrate or opposing surfaces, and the first device and the second device may be positioned on opposing surfaces of the graphene substrate. The first dopant species may include at least one of an amine, an imine, an organic free radical, or an aromatic molecule, and the second dopant species may include at least one of an aromatic molecule, boron, gold, bismuth, antimony, bromine, iodine, a diazonium salt, hydrogen, or an alkyl group.

The second dopant species may differ from the first dopant species. The first and second dopant species may differ in concentration, attachment pattern to the graphene substrate, or number density. Any of the dopant species may include a plurality of intermixed dopant subspecies, which may include the same or different subspecies, and which may differ in attachment pattern or relative concentration from one another. One or more dopant subspecies may vary in concentration within the first defined region. The first dopant species may include a first bound moiety affixed to the graphene substrate and a first free moiety removably attached to the first bound moiety, in which case the difference in the electronic property may be a function of a property of the free moiety. The second dopant species may include a second bound moiety affixed to the graphene substrate and a second free moiety removably attached to the second bound moiety, in which case the first and second bound moieties may be the same or different. The first or second dopant species may be adsorbed onto the graphene substrate (e.g., chemisorbed or physisorbed), chemically bound to the substrate (e.g., covalently bound), or intercalated in the graphene substrate. The first or second dopant species may vary in concentration or attachment pattern within the first n-type or p-type defined region, respectively. The first p-type defined region may surround the first n-type defined region, or the first n-type defined region may surround the first p-type defined region.

In another aspect, a method of forming an electronic device on a graphene substrate includes functionalizing a first defined region of the graphene substrate with a first dopant species selected to confer an n-type character on the first defined region, and functionalizing a second defined region of the graphene substrate with a second dopant species selected to confer a p-type character on the second defined region.

Functionalizing the first or second defined region may include selectively exposing the first defined region to a chemical solution, lithographically masking the graphene substrate, applying a spatially patterned electrical potential to the graphene substrate, or introducing a defect into the graphene substrate. The first defined region and the second defined region may be functionalized simultaneously or sequentially. The second defined region may overlap the first defined region. Functionalizing the first or second defined region may include co-depositing the second dopant species with the first dopant species. Either or both of the dopant species may exclude the other from depositing on the graphene substrate. The second defined region may surround the first defined region, or the first defined region may surround the second defined region.

In another aspect, an electronic device includes a graphene substrate including a first defined region and a second defined region differing in at least one electronic property (e.g., Fermi level, band structure, carrier populations, mobility, tunneling behavior, or conductive character) from the first defined region. The first region is chemically functionalized with a first dopant species on a first surface of the graphene substrate, and the second region is chemically functionalized with a second dopant species on a second surface of the graphene substrate. The second surface opposes the first surface.

The first region may be chemically functionalized on opposing surfaces of the graphene substrate. The difference in the at least one electronic property may be a consequence of the functionalization of the first and second defined regions. The first and second defined regions may form a semiconducting junction, and may be parts of a component such as a diode, a transistor, a switch, a resistor, a capacitor, an inductor, a sensor, or an interconnect. The device may further include a first interconnect electrically connected to the first defined region and a second interconnect electrically connected to the second defined region. The graphene substrate may include a single layer or a multilayer. The first defined region and the second defined region may be adjacent, and either may not include an edge of the graphene substrate. The device may further include a third defined region differing in at least one electronic property from each of the first defined region and the second defined region. The third defined region may be chemically functionalized with a third dopant species. The first or second dopant species may includes at least one of an amine, an imine, an organic free radical, an aromatic molecule, nitrogen, boron, gold, bismuth, antimony, bromine, iodine, a diazonium salt, hydrogen, or an alkyl group, and may be the same or different. The first and second dopant species may differ in concentration, attachment pattern to the graphene substrate, or number density.

Either or both dopant species may include a plurality of intermixed dopant subspecies, which may include the same or different subspecies, and which may differ in attachment pattern or relative concentration from one another. One or more dopant subspecies may vary in concentration within the first defined region. The first dopant species may include a first bound moiety affixed to the graphene substrate and a first free moiety removably attached to the first bound moiety, in which case the difference in the electronic property may be a function of a property of the free moiety. The second dopant species may include a second bound moiety affixed to the graphene substrate and a second free moiety removably attached to the second bound moiety, in which case the first and second bound moieties may be the same or different. The first dopant species may be adsorbed onto the graphene substrate (e.g., chemisorbed or physisorbed), chemically bound to the substrate (e.g., covalently bound), or intercalated in the graphene substrate. The first dopant species may vary in concentration or attachment pattern within the first defined region. The second defined region may surround the first defined region.

In another aspect, an electronic device includes a graphene substrate including a first defined region and a second defined region differing in at least one electronic property (e.g., Fermi level, band structure, carrier populations, mobility, tunneling behavior, or conductive character) from the first defined region. The first region is chemically functionalized with a first dopant species and a second dopant species on opposing surfaces of the graphene substrate.

The difference in the at least one electronic property may be a consequence of the functionalization of the first and second defined regions. The first and second defined regions may form a semiconducting junction, and may be parts of a component such as a diode, a transistor, a switch, a resistor, a capacitor, an inductor, a sensor, or an interconnect. The device may further include a first interconnect electrically connected to the first defined region and a second interconnect electrically connected to the second defined region. The graphene substrate may include a single layer or a multilayer. The first defined region and the second defined region may be adjacent, and either may not include an edge of the graphene substrate. The device may further include a third defined region differing in at least one electronic property from each of the first defined region and the second defined region. The third defined region may be chemically functionalized with a third dopant species. The first or second dopant species may includes at least one of an amine, an imine, an organic free radical, an aromatic molecule, nitrogen, boron, gold, bismuth, antimony, bromine, iodine, a diazonium salt, hydrogen, or an alkyl group, and may be the same or different. The first and second dopant species may differ in concentration, attachment pattern to the graphene substrate, or number density.

Either or both dopant species may include a plurality of intermixed dopant subspecies, which may include the same or different subspecies, and which may differ in attachment pattern or relative concentration from one another. One or more dopant subspecies may vary in concentration within the first defined region. The first dopant species may include a first bound moiety affixed to the graphene substrate and a first free moiety removably attached to the first bound moiety, in which case the difference in the electronic property may be a function of a property of the free moiety. The second dopant species may include a second bound moiety affixed to the graphene substrate and a second free moiety removably attached to the second bound moiety, in which case the first and second bound moieties may be the same or different. The first dopant species may be adsorbed onto the graphene substrate (e.g., chemisorbed or physisorbed), chemically bound to the substrate (e.g., covalently bound), or intercalated in the graphene substrate. The first dopant species may vary in concentration or attachment pattern within the first defined region. The second defined region may surround the first defined region.

In another aspect, a method of forming an electronic device on a graphene substrate includes functionalizing a first defined region of the graphene substrate with a first dopant species on a first side of the graphene substrate, and functionalizing a second defined region of the graphene substrate with a second dopant species on an opposing second side of the graphene substrate. The first defined region and the second defined region differ in at least one electronic property (e.g., Fermi level, band structure, carrier populations, mobility, tunneling behavior, or conductive character).

Functionalizing the first or second defined region may include selectively exposing the first defined region to a chemical solution, lithographically masking the graphene substrate, applying a spatially patterned electrical potential to the graphene substrate, or introducing a defect into the graphene substrate. The first defined region and the second defined region may be functionalized simultaneously or sequentially. The second defined region may overlap the first defined region. Either or both of the dopant species may exclude the other from depositing on the graphene substrate. The second defined region may surround the first defined region, or the first defined region may surround the second defined region.

In another aspect, a method of making an electronic device includes applying a first functional group to a graphene substrate in a first predetermined pattern, and applying a second functional group in a second predetermined pattern to the graphene substrate patterned with the first functional group. The second predetermined pattern is at least partially determined by the application of the first functional group.

The method may further include removing at least a portion of the first functional group from the graphene substrate subsequent to applying the second functional group. The first or second predetermined pattern may be aligned in a predetermined relationship to a crystal direction of the graphene substrate. Applying the first functional group may include selectively exposing the first defined region to a chemical solution, lithographically masking the graphene substrate, applying a spatially patterned electrical potential to the graphene substrate, or introducing a defect into the graphene substrate. Either or both of the functional groups may exclude the other from depositing on the graphene substrate.

In another aspect, a method of making an electronic device includes applying a first functional group to a graphene substrate, and applying a second functional group to the first functional group in a predetermined pattern.

The second functional group may bonds to or exchange with the first functional group. After application of the second functional group, the graphene substrate may include a first region and a second region differing in at least one electrical property (e.g., Fermi level, band structure, carrier populations, mobility, tunneling behavior, or conductive character). The predetermined pattern may be aligned in a predetermined relationship to a crystal direction of the graphene substrate. Applying the first functional group may include selectively exposing the first defined region to a chemical solution, lithographically masking the graphene substrate, applying a spatially patterned electrical potential to the graphene substrate, or introducing a defect into the graphene substrate. Either or both of the functional groups may exclude the other from depositing on the graphene substrate.

In another aspect, an electronic device includes a graphene substrate including a first defined region and a second defined region differing in at least one electronic property (e.g., Fermi level, band structure, carrier populations, mobility, tunneling behavior, or conductive character) from the first defined region. The first region is chemically functionalized with a first dopant species and the second defined region is chemically functionalized with a second dopant species, and the first defined region has a border aligned with a crystal direction of the graphene substrate.

The difference in the at least one electronic property may be a consequence of the functionalization. The first and second defined regions may form a semiconducting junction, and may be parts of a component such as a diode, a transistor, a switch, a resistor, a capacitor, an inductor, a sensor, or an interconnect. The device may further include interconnects electrically connected to the first and second defined regions. The graphene substrate may include a single layer or a multilayer. The first and second regions may be adjacent, and either or both may be remote from an edge of the graphene substrate. The device may further include a third defined region differing in at least one electronic property from the first and second defined regions, which may be functionalized with a third dopant species. The graphene substrate may be disposed on a base substrate (e.g., graphite or a crystal containing a noncarbon component). The first and second dopant species may functionalize a common surface of the substrate or opposing surfaces, and either or both may include an amine, an imine, an organic free radical, an aromatic molecule, nitrogen, boron, gold, bismuth, antimony, bromine, iodine, a diazonium salt, hydrogen, or an alkyl group, and may be different or the same. The first and second dopant species may differ in concentration, attachment pattern to the graphene substrate, or number density.

Either or both dopant species may include a plurality of intermixed dopant subspecies, which may include the same or different subspecies, and which may differ in attachment pattern or relative concentration from one another. One or more dopant subspecies may vary in concentration within the first defined region. The first dopant species may include a first bound moiety affixed to the graphene substrate and a first free moiety removably attached to the first bound moiety, in which case the difference in the electronic property may be a function of a property of the free moiety. The second dopant species may include a second bound moiety affixed to the graphene substrate and a second free moiety removably attached to the second bound moiety, in which case the first and second bound moieties may be the same or different. The first dopant species may be adsorbed onto the graphene substrate (e.g., chemisorbed or physisorbed), chemically bound to the substrate (e.g., covalently bound), or intercalated in the graphene substrate. The first dopant species may vary in concentration or attachment pattern within the first defined region. The second defined region may surround the first defined region, or the first defined region may surround the second defined region.

In another aspect, an electronic device includes a graphene substrate including a first defined region and a second defined region differing in at least one electronic property (e.g., Fermi level, band structure, carrier populations, mobility, tunneling behavior, or conductive character) from the first defined region. The first region is chemically functionalized with a first dopant species, has a border aligned with a crystal direction of the graphene substrate, and is remote from any edge of the graphene substrate.

The second defined region may be chemically functionalized with a second dopant species, which may differ from the first dopant species. The first and second dopant species may differ in concentration, attachment pattern on the graphene substrate, or number density. Either or both dopant species may include a plurality of intermixed dopant subspecies, which may include the same or different subspecies, and which may differ in attachment pattern or relative concentration from one another. One or more dopant subspecies may vary in concentration within the first defined region. The first and second dopant species may functionalize a common surface of the substrate or opposing surfaces, and either or both may include an amine, an imine, an organic free radical, an aromatic molecule, nitrogen, boron, gold, bismuth, antimony, bromine, iodine, a diazonium salt, hydrogen, or an alkyl group, and may be different or the same.

The difference in the at least one electronic property may be a consequence of the fractionalization. The first and second defined regions may form a semiconducting junction, and may be parts of a component such as a diode, a transistor, a switch, a resistor, a capacitor, an inductor, a sensor, or an interconnect. The device may further include interconnects electrically connected to the first and second defined regions. The graphene substrate may include a single layer or a multilayer. The first and second regions may be adjacent, and the second region may be remote from an edge of the graphene substrate. The device may further include a third defined region differing in at least one electronic property from the first and second defined regions, which may be functionalized with a third dopant species. The graphene substrate may be disposed on a base substrate (e.g., graphite or a crystal containing a noncarbon component). The first dopant species may include a first bound moiety affixed to the graphene substrate and a first free moiety removably attached to the first bound moiety, in which case the difference in the electronic property may be a function of a property of the free moiety. The second defined region may be chemically functionalized with a second dopant species including a second bound moiety affixed to the graphene substrate and a second free moiety removably attached to the second bound moiety, in which case the composition of the first and second bound moieties may be the same or different. The first dopant species may be adsorbed onto the graphene substrate (e.g., chemisorbed or physisorbed), chemically bound to the substrate (e.g., covalently bound), or intercalated in the graphene substrate. The first dopant species may vary in concentration or attachment pattern within the first defined region. The second defined region may surround the first defined region, or the first defined region may surround the second defined region.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
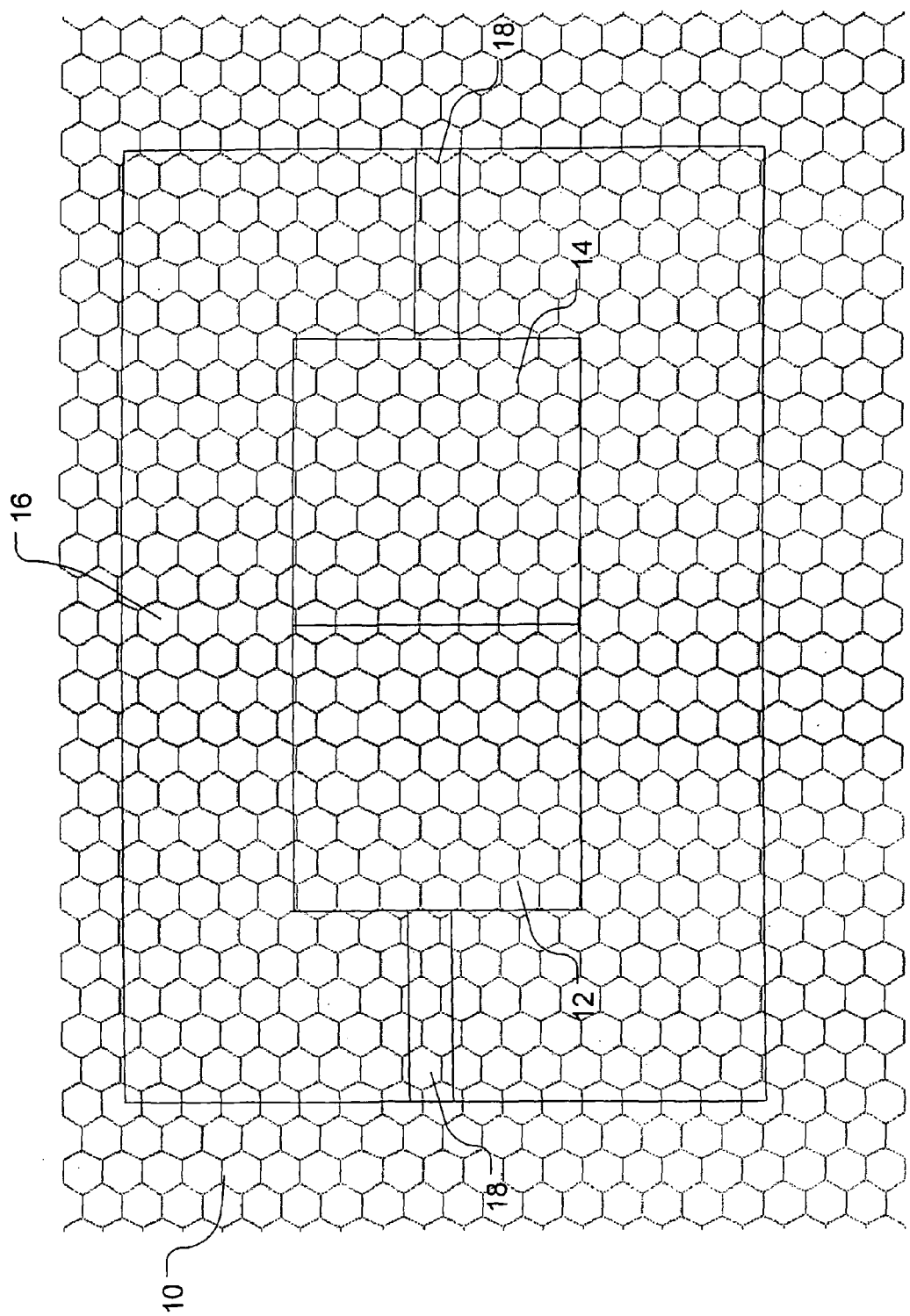
FIG. 1 is a schematic of a graphene-based electronic device.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Graphene, a freestanding monolayer of graphite, exhibits unique electronic properties, including very high conductivity and unusual quantum effects (e.g., zero effective mass charge carriers with low scattering). Graphene sheets may be manufactured by flaking off of graphite (e.g., highly oriented pyrolytic graphite (HOPG)), by growing as an epitaxial layer on other crystals and chemically etching to remove the graphene, or by reducing graphite oxide. See, e.g., Li, et al., "Large-area synthesis of high-quality and uniform graphene films on copper foils," *Science* 324:1312-1314 (2009); Geim, et al., "The rise of graphene," *Nature Mat'ls* 6:183-191 (March 2007); Benayad, et al., "Controlling work function of reduced graphite oxide with Au-ion concentration," *Chem Phys Lett,* 475: 91-95 (2009), each of which is incorporated by reference herein. Either before or after removal from the graphite or heterogeneous substrate, graphene may be chemically functionalized to produce electronic devices. While the description that follows focuses on monolayer graphene, chemical functionalization of oligolayers may also yield interesting electronic properties.

Figure 2:
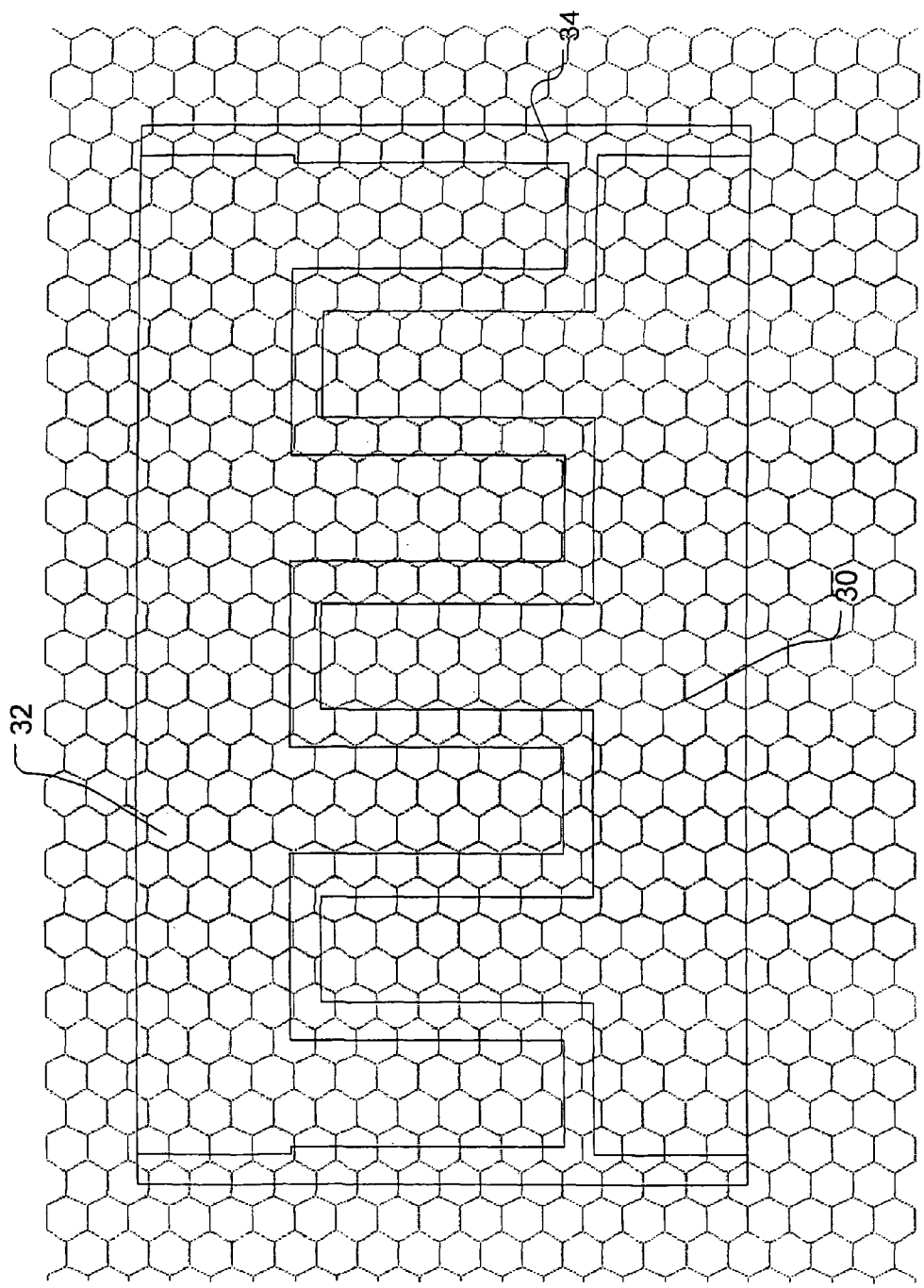
FIG. 2 is a schematic of a graphene-based capacitor.

FIG. 1 is a schematic of a graphene-based electronic device. In the illustrated embodiment, graphene sheet 10 includes three doped regions 12, 14, 16. Region 12 is functionalized with a species that renders it n-type relative to pristine (pure) graphene. Region 14 is functionalized with a species that renders it p-type relative to pristine graphene, and region 16 is functionalized with a species that renders it more insulating than pristine graphene. Regions 18 may be undoped, functionalized with a conductive species, or functionalized with a species that renders the underlying graphene more conductive than region 16, to form interconnects. In the illustrated embodiment, the device functions as a simple p-n junction diode. By analogy with silicon-based semiconducting devices, other arrangements of p-type and n-type regions may be used to construct transistors, switches, and other electronic components. Further, dopant species and/or concentrations may be varied in some regions to produce other components, such as resistors, capacitors, inductors, sensors, or interconnects. For example, FIG. 2 illustrates a graphene-based capacitor. Interdigitated conductive regions 30 and 32 are separated by dielectric region 34 in a two-dimensional analog of a typical capacitor design. In other embodiments, conductive regions may form opposing T-shapes or double spirals, for example. A spiral configuration may also be used to form an inductor, for example.

Figure 3:
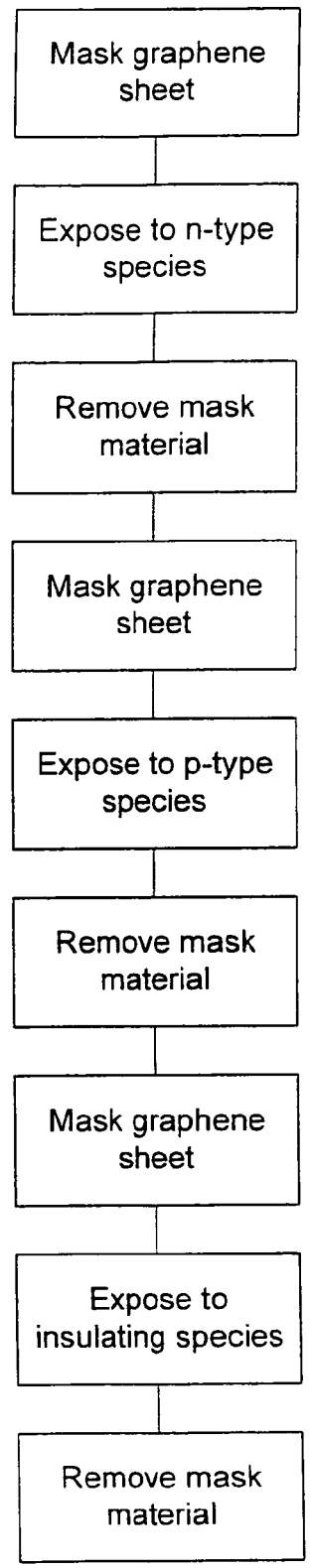
FIG. 3 is a flow chart describing a process for forming a graphene-based electronic device.

A method of forming a device like that in FIG. 1 is illustrated in FIG. 3. In the illustrated embodiment, a pure graphene sheet is masked (using conventional lithographic methods) to expose only region 12, which is then exposed to a chemical that forms an n-type region. For example, exposure of graphene to $NH_3$ gas at elevated temperatures will tend to form an n-type region by covalent bonding, particularly at edges and defect sites, as described in Wan, et al., *Science* 324(5928):768-771 (May 2009), which is incorporated by reference herein. N-doped graphene may also be formed by chemical vapor deposition of a mixture of $NH_3$ and $CH_4$ gas, or by arc discharge of carbon electrodes in the presence of $H_2$/pyridine or $H_2/NH_3$. See, e.g., Wei, et al., "Synthesis of N-Doped Graphene by Chemical Vapor Deposition and Its Electrical Properties," *Nano Lett.* 9(5):1752-1758 (2009); Panchakarla, et al., "Synthesis, Structure, and Properties of Boron and Nitrogen Doped Graphene," *Adv. Mat.,* 21(46):4726-4730 (August 2009), each of which are incorporated by reference herein. Other suitable electron-donating agents which may be adsorbed onto the graphene surface include organic free radicals (e.g., 4-amino-TEMPO), aromatic molecules with electron-donating groups, or electron-donating macromolecules such as poly (ethylene imine). See, e.g., Choi, et al., "Chemical Doping of Epitaxial Graphene by Organic Free Radicals," *J. Phys. Chem. Lett.* 2010(1):505-509 (2010); Dong, et al., "Doping Single-Layer Graphene with Aromatic Molecules," *Small* 5(12): 1422-1426 (June 2009); Farmer, et al., "Chemical Doping and Electron-Hole Conduction Asymmetry in Graphene Devices," *Nano Lett.,* 9(1):388-392 (2009), each of which are incorporated by reference herein. In the illustrated embodiment, the region 12 is remote from any edge of the graphene sheet (i.e., far enough away from the edge that electrical properties imparted by the donor species are no more than minimally affected by the existence of the edge). In some embodiments, the borders of region 12 may be aligned with a crystal direction of the graphene, while in other embodiments, the borders may be at any angle to the crystal axis. In some embodiments, application of the functional group may include applying an electric potential to the graphene substrate, e.g., a patterned electric potential.

In an embodiment, it may be desirable to introduce one or more defects into the region before exposure to $NH_3$ (or other dopants), which is believed to be chemically reactive at defect sites. For example, a focused electron beam may be used to introduce one or more defects into the graphene lattice at region 12 before exposure, or the masked region may be exposed to an oxygen plasma. (In an embodiment, simultaneous n-doping and reduction of oxidized graphene may be achieved by exposure to an oxygen plasma. See, e.g., Li et al., "Simultaneous Nitrogen-Doping and Reduction of Graphene Oxide," *J. Am. Chem. Soc.,* 131(43):15939-15944 (2009), which is incorporated by reference herein.) Very precisely placed defect sites may also be introduced by use of an atomic force microscope. In an embodiment, with sufficiently well-controlled introduction of defects and chemical functionalization, it may be possible to eliminate the need to mask the region, defining the doped region by selective introduction of defects into the graphene lattice. In an embodiment, it may be possible to anneal or otherwise heal such defects after doping.

Once region 12 has been formed, the substrate may be cleaned and remasked according to standard lithographic techniques, then exposed to a different electron donor species to form p-type region 14. For example, substitution of boron into the graphene backbone will tend to form a p-type region, as will adsorption (or intercalation in graphene oligolayers) of bromine, iodine, aromatic structures including electron-withdrawing groups, or diazonium salts (e.g., 4-bromobenzene diazonium tetrafluorate), or deposition of gold, bismuth, or antimony (in some embodiments, followed by annealing). See, e.g., Panchakarla, et al., "Synthesis, Structure, and Properties of Boron and Nitrogen Doped Graphene," *Adv. Mat.*, 21(46):4726-4730 (August 2009); Jung, et al., "Charge Transfer Chemical Doping of Few Layer Graphenes: Charge Distribution and Band Gap Formation," *Nano Lett.*, 9(12): 4133-4137 (2009); Dong, et al., "Doping Single-Layer Graphene with Aromatic Molecules," *Small* 5(12):1422-1426 (June 2009); Farmer, et al., "Chemical Doping and Electron-Hole Conduction Asymmetry in Graphene Devices," *Nano Lett.*, 9(1):388-392 (2009); Gierz, et al., "Atomic Hole Doping of Graphene," *Nano Lett.* 8(12):4603-4607 (2008), each of which are incorporated by reference herein. For any of these species, in some embodiments, it may be preferable to introduce defects into the graphene as described above.

Once region 14 has been formed, the substrate may be cleaned and remasked, then exposed to a different to form region 16. For example, exposure of graphene to atomic hydrogen (e.g., as a plasma) will tend to form an insulating region ("graphane"). (P-type regions may also be produced by annealing of graphane regions formed by exposure to hydrogen plasma.) See, e.g., Elias, et al., "Control of Graphene's Properties by Reversible Hydrogenation: Evidence for Graphane," *Science* 323:610-613 (2009), which is incorporated herein by reference. In general, selective rehybridization of graphene's carbon atoms from an $sp^2$ state to an $sp^3$ state will tend to open a band gap, thus producing semiconducting or insulating regions. For example, alkylation or arylation may also produce semiconducting or insulating regions. Optionally, after formation of region 16, regions 18 may also be formed by lithographic methods. Alternatively, regions 18 may consist essentially of pristine graphene. It will be understood that the steps of forming the different regions may occur in any convenient order. For example, if the conditions required to produce an n-type region might tend to degrade a p-type region on the same sheet, then it may be preferable to firm produce the n-type region(s), and follow with production of the p-type region(s).

One challenge in nanolithography is registration when successive masks are used on the same substrate. In an embodiment, registration "marks" may be placed on the graphene substrate in the form of easily detectable functional groups (which may or may not have any function in a final electronic device). For example, electroluminescent polymers (e.g., oligomers) such as poly(p-phenylene vinylene) may be well suited to be used as markers, forming large, rigid structures which may be detected by their photon emission. In an embodiment, X-ray emitters may be placed on the substrate, but caution is needed to avoid degradation of the final product by the emitted X-rays.

In an embodiment, rather than individually functionalizing each region of a graphene sheet with a different dopant species as described above, it may be desirable to functionalize the entire sheet (or a portion of the sheet) with a species, and then to lithographically create the desired regions, either by swapping the whole functional molecule, or by adding new functionality (as a free moiety attached to a bound moiety affixed to the substrate) that confers the desired properties. In an embodiment, graphene circuits may be made partially or fully rewritable by such methods. For example, carbon nanofibers have been modified with electrochemically active ferrocene groups by the Cu(I)-catalyzed azide-alkyne cycloaddition reaction ("click" chemistry). See, e.g., Landis, et al., "Covalent grafting of redox-active molecules to vertically aligned carbon nanofiber arrays via 'click' chemistry," *Chem. Mater.*, 21(4):724-730 (2009), which is incorporated by reference herein. This approach is expected to be applicable to modification of graphene functionalized with azide, as well. In an embodiment, functional groups may be adsorbed (e.g., physisorbed or chemisorbed) onto the graphene surface, rather than covalently bonded. Some dopant species may also intercalate in oligolayers of the graphene substrate.

While the above methods have been described in connection with production of a single p-n junction surrounded by an insulator, more complicated geometries, for example including many interconnected devices, may be produced by following the same steps, for example by using masks that include a plurality of openings to form many regions having each desired carrier density. In general, most any two-dimensional arrangement of doped regions for silicon devices is expected to have a graphene analog.

Further, the above methods are described with reference to deposition of a single dopant species in each region. In some embodiments, multiple dopant species may be applied to a single region. These may co-deposit (in a spontaneously ordered, partially ordered, or random configuration), or the deposition of one species may exclude the bonding of another to the graphene surface. In the latter case, the exclusion effect may be used to improve registration of multiple regions. For example, if an electron donor dopant species also has the property of excluding an electron acceptor dopant species, then p-type region 14 might be produced first. Subsequent masking to produce region 12 would not need to be precisely aligned at the border between regions 12 and 14, but could form some degree of overlap, and the exclusion of the acceptor species would produce two adjacent but not overlapping regions.

Certain species are known to deposit on graphene in ordered patterns that depend on the character of their bond with carbon and also on steric considerations. These effects may be used in sequential reactions to deposit other species in an ordered fashion at less than full saturation. For example, it has been calculated that optimum coverage of phenyl groups on graphene is at 2 phenyl groups per unit cell of 18 graphene carbon atoms, for a coverage density of 11%. See, e.g., Bekyarova et al., *Phys. Status Solidi RRL,* 3(6):187-189 (2009), which is incorporated by reference herein. A graphene substrate may be covered with phenyl groups at this density, and then subsequently exposed to a physically smaller dopant species (e.g., a metal or a halide), which is expected to deposit in between the phenyl groups. Finally, the phenyl groups may optionally be removed, leaving behind the smaller dopant species at a less than fully saturated concentration. In an embodiment, the phenyl groups may be adsorbed, rather than covalently bonded to the graphene, to facilitate removal. More complicated multistep processes for doping may also be envisioned, for example following the removal of the phenyl groups with doping with another small dopant species that does not displace the first non-saturated small dopant species, thereby achieving a patterned co-deposited layer. These techniques may also be used, for example to produce a graphene substrate including two doped regions which are each doped with the same intermixed co-dopants, but in different concentrations, number density, or attachment pattern. Dopants may also be deposited in a gradient concentration across a region, a random concentration, or in any other suitable pattern in which concentration varies with in a region. A mixture of dopants may also be simultaneously co-deposited in a single region, in which case the dopants may deposit randomly, in a partially ordered fashion, or in a fully ordered fashion (e.g., by spontaneous self assembly into an ordered array).

Figure 4:
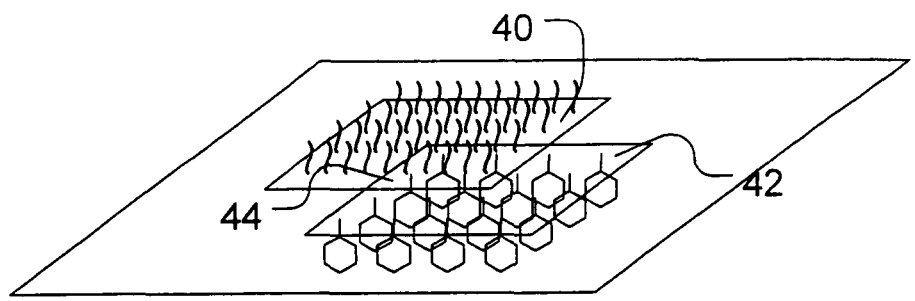
FIG. 4 is a schematic of a two-sided graphene-based device.

In an embodiment, one or both sides of a free graphene sheet may be functionalized. For example, in the embodiment shown in FIG. 4, region 40 is functionalized with a first dopant species, and region 42 is functionalized with a second dopant species on the opposite side of the graphene sheet. Region 44 represents an overlap area between the functionalized regions which is expected to have different electronic properties than either of the non-overlapping functionalized regions.

In an embodiment, instead of or in addition to lithographic masking of the substrate, deposition may be controlled by applying a patterned electric or magnetic field in the vicinity of the substrate.

In one example, a p-n junction in the configuration of FIG. 1 is formed as follows. A pristine graphene substrate is formed by flaking from HOPG. The substrate is masked with a lithographic mask exposing region 16 and exposed to a cold hydrogen plasma (0.1 mbar 10% hydrogen-90% argon mixture at 30 cm for 2 hr) to form graphane in the region. (See, Elias, et al., supra.) The mask is then removed.

The substrate is masked with a water- and alcohol-compatible lithographic mask that exposes region 14, and then immersed in a 1 mM solution of 4-bromobenzenediazonium tetrofluoroborate in a 1:1 water/methanol mixture at 300 K for 2 h and rinsed with water and methanol, thereby doping the region with diazonium to produce a p-type region. (See Farmer et al., supra.) The lithographic mask is then removed.

Finally, the substrate is then masked with a lithographic mask that exposes regions 12 and 14. The surface is dosed using a direct doser (controlled by means of a variable leak valve) with azidotrimethylsilane (ATS), which adsorbs via nitrene radical onto the graphene surface. (See Choi et al., supra.) The already-doped region 14 excludes the ATS, so only region 12 is doped to produce an n-type region. The mask is then removed. Regions 18 have not been exposed to any of the graphene-modifying procedures in this example, and thus remain pristine metallic or semiconducting graphene.

In another example, an epitaxially grown graphene layer on a nitrogen-doped SiC substrate has an intrinsic n-type character. The graphene is masked to expose region 14 and gold is deposited using a Knudsen cell at room temperature. The substrate is then annealed at 700° C. for 5 mM, which simultaneously allows the gold to bond to the graphene layer (forming a p-type region) and decomposes the resist. (See, Gierz et al., supra.) The layer is then remasked to cover regions 12 and 14 and expose region 16 and exposed to a solution of 4-nitrophenyl diazonium tetrofluoroborate, which forms an insulating region. (See Bekyarova et al., supra.) The resist is then removed, leaving a p-n junction surrounded by an insulating region.

In an embodiment, dopants may be selected to adjust other electronic properties of graphene besides the carrier populations described above, such as Fermi level, band structure, mobility, tunneling behavior, or conductive character. For example, effects of adsorbates on Fermi level and Fermi velocity are discussed in Khomyakov, et al., "First-principles study of the interaction and charge transfer between graphene and metals," *Phys Rev B,* 79:195425 (2009); Giovannetti, et al., "Doping graphene with metal contacts," *Phys Rev Lett,* 101:026803 (2008); Benayad, et al., "Controlling work function of reduced graphite oxide with Au-ion concentration," *Chem Phys Lett,* 475:91-95 (2008); and Tapaszto, et al., "Tuning the electronic structure of graphene by ion irradiation," *Phys Rev B,* 78:233407 (2008), each of which is incorporated by reference herein.

In an embodiment, rather than or in addition to adjusting charge carrier populations as discussed above, dopant species may be selected to modify optical or electro-optical properties of graphene, such as optical gain, transmissivity, reflectivity, permittivity, permeability, refractive index, or anisotropy, for example to form plasmonic devices (lasing or passive) or other nonlinear electro-optical devices. Pristine graphene is found to absorb $\pi\alpha=2.3\%$ of incident white light despite having a thickness of one atom (where $\alpha$ is the fine structure constant, approximately $1/137$). Disruption of the graphene's $sp^2$ network (e.g., by $sp^3$ bond formation) reduces the transparency as observed in graphene oxide. See, e.g., Nair, et al., "Fine structure constant defines visual transparency of graphene," *Science,* 320:1308 (2008); Kim, et al., "Large-scale pattern growth of graphene films for stretchable transparent electrodes," *Nature,* 457:706-710 (2009); U.S. Published Application No. 2009/0146111 to Shin et al.; Rao, et al., "Some novel attributes of graphene."*J Phys Chem Lett;* 1:572-580 (2010), each of which is incorporated by reference herein. Those of skill in the art will recognize how to use these optical or electro-optical properties to construct various graphene-based optoelectronic devices by analogy with silicon-based or other known devices, such as lasers, light-emitting diodes, plasmon waveguides, optical waveguides, optical gratings, fluorescent devices, light-absorbing devices, photoelectron converters, phaseshifting devices, interferometers, optical couplers, or plasmon couplers.

While various aspects and embodiments have been disclosed herein, other aspects and embodiments will be apparent to those skilled in the art based on the teachings herein. The various aspects and embodiments disclosed herein are for purposes of illustration and are not intended to be limiting, with the true scope and spirit being indicated by the following claims.

While particular aspects of the present subject matter described herein have been shown and described, it will be apparent to those skilled in the art that, based upon the teachings herein, changes and modifications may be made without departing from this subject matter described herein and its broader aspects and, therefore, the appended claims are to encompass within their scope all such changes and modifications as are within the true spirit and scope of this subject matter described herein.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

It will be understood that, in general, terms used herein, and especially in the appended claims, are generally intended as "open" terms (e.g., the term "including" should be interpreted as "including but not limited to," the term "having" should be interpreted as "having at least," the term "includes" should be interpreted as "includes but is not limited to," etc.). It will be further understood that if a specific number of an introduced claim recitation is intended, such an intent will be explicitly recited in the claim, and in the absence of such recitation no such intent is present. For example, as an aid to understanding, the following appended claims may contain usage of introductory phrases such as "at least one" or "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a functional group" should typically be interpreted to mean "at least one functional group"); the same holds true for the use of definite articles used to introduce claim recitations. In addition, even if a specific number of an introduced claim recitation is explicitly recited, it will be recognized that such recitation should typically be interpreted to mean at least the recited number (e.g., the bare recitation of "two functional groups," or "a plurality of functional groups," without other modifiers, typically means at least two functional groups). Furthermore, in those instances where a phrase such as "at least one of A, B, and C," "at least one of A, B, or C," or "an [item] selected from the group consisting of A, B, and C," is used, in general such a construction is intended to be disjunctive (e.g., any of these phrases would include but not be limited to systems that have A alone, B alone, C alone, A and B together, A and C together, B and C together, or A, B, and C together, and may further include more than one of A, B, or C, such as $A_1$, $A_2$, and C together, A, $B_1$, $B_2$, $C_1$, and $C_2$ together, or $B_1$ and $B_2$ together). It will be further understood that virtually any disjunctive word or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Moreover, "can" and "optionally" and other permissive terms are used herein for describing optional features of various embodiments. These terms likewise describe selectable or configurable features generally, unless the context dictates otherwise.

The herein described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality. Any two components capable of being so associated can also be viewed as being "operably coupleable" to each other to achieve the desired functionality. Specific examples of operably coupleable include but are not limited to physically mateable or interacting components or wirelessly interacting components.

What is claimed is:

1. An electronic device, comprising:
   a graphene substrate including a first defined region and a second defined region differing in at least one electronic property from the first defined region,
   wherein the first region is chemically functionalized with a first dopant species on a first surface of the graphene substrate, and
   wherein the second region is chemically functionalized with a second dopant species on a second surface of the graphene substrate, the second surface opposing the first surface.

2. The device of claim 1, wherein the first region is chemically functionalized on opposing surfaces of the graphene substrate.

3. The device of claim 1, wherein the difference in the at least one electronic property is a consequence of the functionalization of the first and second defined regions.

4. The device of claim 1, wherein the first and second defined regions form a semiconducting junction.

5. The device of claim 1, further comprising a first interconnect electrically connected to the first defined region and a second interconnect electrically connected to the second defined region.

6. The device of claim 1, wherein the first defined region and the second defined region are adjacent.

7. The device of claim 1, further comprising a third defined region differing in at least one electronic property from each of the first defined region and the second defined region.

8. The device of claim 7, wherein the third defined region is chemically functionalized with a third dopant species.

9. The device of claim 1, wherein the second dopant species differs from the first dopant species.

10. The device of claim 1, wherein the first dopant species and the second dopant species differ in concentration.

11. The device of claim 1, wherein the first dopant species and the second dopant species differ in attachment pattern to the graphene substrate.

12. The device of claim 1, wherein the first dopant species and the second dopant species differ in number density on the graphene substrate.

13. The device of claim 1, wherein the first dopant species includes a plurality of intermixed dopant subspecies.

14. The device of claim 13, wherein the second dopant species includes at least one member of the plurality of intermixed dopant subspecies.

15. The device of claim 13, wherein the second dopant species includes the same plurality of intermixed dopant subspecies as the first dopant species.

16. The device of claim 14, wherein at least one member of the plurality of intermixed dopant subspecies varies in concentration within the first defined region.

17. The device of claim 3, wherein the first dopant species includes a first bound moiety affixed to the graphene substrate and a first free moiety removably attached to the first bound moiety.

18. The device of claim 1, wherein the first dopant species varies in attachment pattern within the first defined region.

19. The device of claim 2, wherein the first dopant species varies in concentration within the first defined region.

20. An electronic device, comprising:
    a graphene substrate including a first defined region and a second defined region differing in at least one electronic property from the first defined region,
    wherein the first region is chemically functionalized with a first dopant species and a second dopant species on opposing surfaces of the graphene substrate.

21. The device of claim 20, wherein the first and second defined regions form a semiconducting junction.

22. The device of claim 20, further comprising a first interconnect electrically connected to the first defined region and a second interconnect electrically connected to the second defined region.

23. The device of claim 20, wherein the first defined region and the second defined region are adjacent.

24. The device of claim 20, further comprising a third defined region differing in at least one electronic property from each of the first defined region and the second defined region.

25. The device of claim 24, wherein the third defined region is chemically functionalized with a third dopant species.

26. The device of claim 20, wherein the first dopant species includes a plurality of intermixed dopant subspecies.

27. The device of claim 26, wherein the second dopant species includes at least one member of the plurality of intermixed dopant subspecies.

28. The device of claim 26, wherein the second dopant species includes the same plurality of intermixed dopant subspecies as the first dopant species.

29. The device of claim 28, wherein the first defined region and the second defined region differ in attachment pattern of the intermixed dopant subspecies.

30. The device of claim 28, wherein the first defined region and the second defined region differ in relative concentration of the intermixed dopant subspecies.

31. The device of claim 20, wherein the first dopant species includes a first bound moiety affixed to the graphene substrate and a first free moiety removably attached to the first bound moiety.

32. The device of claim 31, wherein the difference in the electronic property is a function of a property of the free moiety.

33. The device of claim 31, wherein the second dopant species includes a second bound moiety affixed to the graphene substrate and a second free moiety removably attached to the second bound moiety.

34. The device of claim 33, wherein the first bound moiety and the second bound moiety have the same composition.

35. A method of forming an electronic device on a graphene substrate, comprising:
    functionalizing a first defined region of the graphene substrate with a first dopant species on a first side of the graphene substrate; and
    functionalizing a second defined region of the graphene substrate with a second dopant species on a second side of the graphene substrate, the second side opposing the first side,
    wherein the first defined region and the second defined region differ in at least one electronic property.

36. The method of claim 35, wherein functionalizing the first defined region includes selectively exposing the first region to a chemical solution.

37. The method of claim 35, wherein functionalizing the first defined region includes lithographically masking the graphene substrate.

38. The method of claim 35, wherein functionalizing the first defined region includes applying a spatially patterned electrical potential to the graphene substrate.

39. The method of claim 35, wherein functionalizing the first defined region includes introducing a defect into the graphene substrate.

40. The method of claim 35, wherein the first dopant species excludes the second dopant species from depositing on the graphene substrate.

* * * * *